United States Patent
Hwang

(10) Patent No.: US 7,636,020 B1
(45) Date of Patent: Dec. 22, 2009

(54) MITIGATING FRACTIONAL SPURS IN FRACTIONAL-N FREQUENCY SYNTHESIZER SYSTEMS

(75) Inventor: Justin Hwang, Mountain View, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 35 days.

(21) Appl. No.: 12/120,127

(22) Filed: May 13, 2008

(51) Int. Cl.
  *H03L 7/18* (2006.01)
  *H04B 1/38* (2006.01)
(52) U.S. Cl. ........................ 331/16; 455/260
(58) Field of Classification Search ................ 331/1 A, 331/8, 16–18, 25; 327/156–159; 332/127; 360/51; 375/376; 455/260
See application file for complete search history.

(56) References Cited

U.S. PATENT DOCUMENTS 7,283,002 B2 * 10/2007 Puma et al. .................... 331/16

* cited by examiner

*Primary Examiner*—David Mis
(74) *Attorney, Agent, or Firm*—Bever, Hoffman & Harms, LLP; Jeanette S. Harms

(57) ABSTRACT

One embodiment of the present invention sets forth a technique for mitigating fractional spurs in fractional-n frequency synthesizer circuits. The technique involves advantageously modifying certain least significant bit values in the programming bits of the fractional-n frequency synthesizer circuit to avoid pathological fractional bit patterns. As a result, fractional spurs present in conventional fractional-n frequency synthesizer circuits may be attenuated, thereby improving the overall quality of the resulting out signal.

21 Claims, 5 Drawing Sheets

MITIGATING FRACTIONAL SPURS IN FRACTIONAL-N FREQUENCY SYNTHESIZER SYSTEMS

BACKGROUND OF THE INVENTION

1. Field of the Invention

Embodiments of the present invention generally relate to synthesized frequency generators, and more specifically to mitigating fractional spurs in fractional-N frequency synthesizer systems.

2. Description of the Related Art

Many conventional electronic systems require a plurality of signal sources, each with specific frequency characteristics. In certain systems, at least one signal source may need to generate arbitrary frequencies, with a requirement of high precision and spectral purity within a specified range. For example, to satisfy certain technical and regulatory requirements, many radio-frequency (RF) transmission systems require very precise frequency control and very high spectral purity in signal sources used in the transmission of RF signals.

A fractional-N frequency synthesizer is one common form of signal generator that may be configured to generate arbitrary frequencies within a specified range. FIG. 1 is a block diagram of a typically fractional-N frequency synthesizer 100. The fractional-N frequency synthesizer 100 typically incorporates a variable frequency oscillator, such as a voltage-controlled oscillator (VCO) 116, and control circuitry configured to form a closed-loop feedback control system for controlling the frequency of the variable frequency oscillator. The control circuitry conventionally includes a phase-frequency detector (PFD) 110, a charge pump 112, a loop filter 114, a feedback divider 120, and a sigma-delta modulator 122. The PFD 110 continuously generates an error signal that is proportional to detected phase error between two input signals such as a reference clock 130 and a feedback clock 132. The charge pump 112 operates on the error signal to generate error pulses, which are transmitted to the loop filter 114. The loop filter 114 integrates the error pulses over time to generate a filtered control voltage. The VCO 116 operates in response to the control voltage to generate an oscillating output signal with a frequency that is a function of the control voltage. The VCO output signal 134 is transmitted to the feedback divider 120, which generates the feedback clock 132. The feedback clock 132 is transmitted to one input of the PFD 110 for comparison with the reference clock 130, which is coupled to the second input of the PFD 110. Using this architecture, the VCO 116 may be controlled in a closed-loop regime to generate an arbitrary multiple of the reference clock 130.

The sigma-delta modulator 122 controls the feedback divider 120, which may be implemented with a programmable integer divider. Some programmable integer dividers are implemented with a dual-modulus prescaler. In one embodiment, the dual-modulus prescaler implements a divide by "N/N+1" scheme, such as a divide 8/9 (either divide by 8 or by 9 in any given full countdown cycle). The programmable integer divider may, for example, implement an 8-bit programmable divider. The feedback clock 132 generated by the feedback divider 120 may be, on average, equal to the frequency of the VCO output signal 134 divided by a fixed-point number that includes both an integer and a fraction component. As is well known in the art, the feedback divider 120 achieves fixed-point, or "fractional," frequency division by dithering count values used to control the feedback divider 120. The sigma-delta modulator 122 accumulates clock cycles against the fraction component of the fixed-point number to generate a signed dither value that is added to the integer component for the next count cycle in the feedback divider 120. The signed dither value accounts for short-term accumulated error between the actual frequency of the feedback clock 132 and a target frequency of the feedback clock 132. The feedback clock 132 is compared against the reference clock by the PFD 110, which generates a negative-feedback control signal used within the control circuit to lock the VCO 116 to a frequency corresponding to the reference clock 130 frequency multiplied by the fixed-point number.

Changes in the signed dither value typically produce a slight short-term shift in the frequency of the VCO output signal 134. This type of shift or modulation of the frequency of the VCO output signal 134 may produce spectral noise in the VCO output signal 134. For example, when the signed dither value changes periodically over a period that is relatively smaller than an observation period, the VCO output signal 134 may include a fractional reference noise "spurs". In certain scenarios, such as when the fraction component can divide evenly into the reference clock frequency 130, "fractional spurs" are generated in the VCO output signal 134. In other instances, fractional spurs may be caused by initial conditions of accumulators within the sigma delta modulator. While fractional-N frequency synthesizer circuits are well known to be very suitable for many applications, including RF systems, fractional spurs are extremely undesirable in these same applications because of high spectral purity requirements.

As the foregoing illustrates, what is needed in the art is a technique for mitigating fractional spurs in fractional-N frequency synthesizer systems.

SUMMARY OF THE INVENTION

One embodiment of the present invention sets forth a frequency synthesizer circuit. The frequency synthesizer circuit includes a closed-loop feedback control system configured to generate an oscillating output signal defined by a divider count, a modulator circuit configured to generate a sequence of divider counts, and a selection circuit configured to modify a divider count and generate a modified divider count. The modified divider count is then used to program the modulator circuit.

One advantage of the disclosed frequency synthesizer circuit is that, by using the modified divider count, fractions spurs may be eliminated from the output signal of the frequency synthesizer circuit, thereby improving overall quality of the signal.

DETAILED DESCRIPTION

Figure 2:
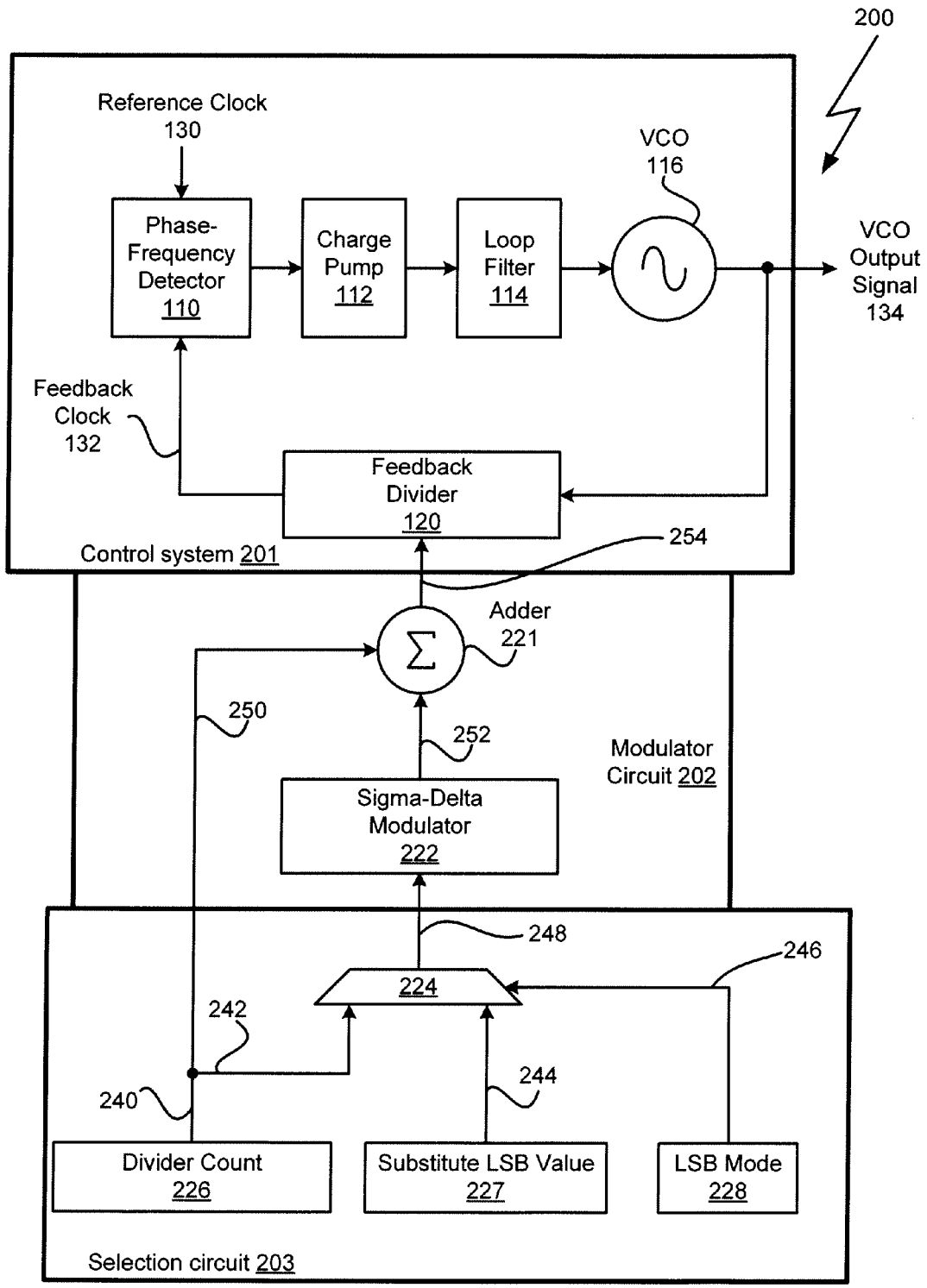
FIG. 2 is a block diagram of a fractional-N frequency synthesizer incorporating fractional spur mitigation, in accordance with one or more aspects of the present invention.

FIG. 2 is a block diagram of a fractional-N frequency synthesizer 200 incorporating fractional spur mitigation, in accordance with one or more aspects of the present invention. The fractional-N frequency synthesizer 200 includes a control system 201, a modulator circuit 202 and a selection circuit 203.

The control system 201 includes a phase-frequency detector (PFD) 110, a charge pump (CP) 112, a loop filter (LF) 114, a voltage controlled oscillator (VCO) 116, and a feedback divider 120. The elements of control system 201 may be similar to the elements in the prior art fractional-N frequency synthesizer 100. The modulator circuit 202 includes an adder 221 and a sigma-delta modulator 222. The selector circuit 203 includes a multiplexer (MUX) 224, a divider count register 226, a substitute least significant bit (LSB) value register (227) and an LSB mode register 228.

The PFD 110 receives, as inputs, a reference clock 130 and a feedback clock 132. The PFD 110 compares the feedback clock 132 input to the reference clock 120 input and generates a phase error signal that represents a detected phase error between the two inputs. For example, the PFD 110 may generate a phase error signal including phase error pulses that are proportional in pulse-width to the detected phase error. The reference clock 120 should be stable and accurate with respect to the oscillation frequency. The reference clock 120 may be generated using any technically feasible means, such as a crystal oscillator.

The PFD 110 transmits the phase error signal to the CP 112, which generates corresponding controlled-current pulses. In one embodiment, the CP 112 uses a switched current source circuit to generate the controlled-current pulses. The controlled-current pulses are filtered by the LP 114 to generate a control voltage that represents a low-pass filtered, time averaged function of the controlled-current pulses. Any technically feasible filter structure may be used for the loop filter, including a variety of well known low-pass resistor-capacitor networks. The control voltage generated by the loop filter 114 is transmitted to the VCO 116.

The VCO 116 generates a VCO output signal 134, which is periodic and proportional in frequency to the control voltage. In one embodiment, the VCO output signal 134 is a sinusoidal wave with high spectral purity. The VCO output signal 134 may be represented by a differential electrical signal, a single-ended electrical signal, or any other technically feasible signal representation. The VCO output signal 134, also referred to as the "output signal," is the primary output signal generated by the fractional-N frequency synthesizer 100.

The VCO output signal 134 is transmitted to the feedback divider 120, which divides the VCO output signal 134 by a number of counts specified by input signal feedback count 254. The feedback divider 220 generates a feedback clock 132, having an average frequency corresponding to an average frequency of the VCO output signal 134 divided by an average of feedback count 254 values. In one embodiment, the feedback divider 120 generates a single pulse at the conclusion of each set of divider count cycles, specified by feedback count 254. The single pulse may substantially correspond in width to one or more cycles of the VCO output signal 134. At the conclusion of each set of divider count cycles, a new feedback count 254 is established in the feedback divider 120 to define a subsequent set of divider count cycles. In one embodiment, the feedback divider 120 incorporates two or more stages of counters, where each of the two or more stages of counters may receive a portion of the overall feedback count 254. Each portion of the feedback count 254 may be updated independently, as appropriate for a given implementation.

A closed control loop is formed by feeding back the feedback clock 132 to the PFD 110 for comparison against the reference clock 130. The parameter being controlled, by negative feedback in the control loop, is the average frequency of the VCO 116, which is locked to a frequency given by the frequency of the reference clock 130 multiplied by a time average of the values of feedback count 254.

The adder 221 adds an integer component 250 to a signed dither value 252 to generate the feedback count 254. In one embodiment, the integer component 250 is an unsigned 8-bit integer and the signed dither value 252 is a 3-bit signed value. The signed dither value 252 may, for example, represent a number in the range −4 to +3 (or −3 to +4), depending on specific system requirements. As is well known in the art, a third-order sigma-delta modulator typically generates a 3-bit signed dither value and represents one suitable implementation selection for the sigma-delta modulator 222. The integer component 250 represents the integer component of a fixed-point divider count value 240, stored within the divider count register 226.

The sigma-delta modulator 222 receives a fraction component 148 from the MUX 124 and generates sequential values for the signed dither value 252, such that the time average of the signed dither value 252 corresponds to the fraction component 248. The fraction component 248 includes F bits. In one embodiment, sigma-delta modulator 122 is a third-order sigma-delta modulator, and F is equal to 17 (which indicates the fraction component 248 is a 17-bit value).

Certain values of the fractional component 248 may generate highly correlated spurs in the VCO output signal 134. Fractions with simple binary representations, such as 0.5, 0.25, 0.125, 0.375, and the like, cause the sigma-delta modulator 222 to generate sequential values for dither value 252 that result in the feedback divider 120 rapidly alternating between the same small set of values for feedback count 254. This highly correlated modulation of the VCO 116 produces concentrated noise, called fractional spurs, in the frequency domain of the VCO output signal 134.

The MUX 224 receives a fraction component 242, including F bits, from the divider count register 226 and a substitute LSB value 244 from the substitute LSB value register 227. The fraction component 242 represents the fractional component of F bits from the fixed-point divider count value 240. The substitute LSB value 244 includes L bits, where L is less than or equal to F. The MUX 224 also receives a MUX control signal 246 from the LSB mode register 228. The output of the MUX 224 is coupled to fraction component 248. When the MUX control signal 246 is de-asserted, the MUX 224 passes the fraction component 242 of F bits through to the fraction component 248, which also includes F bits. When the MUX control signal 246 is asserted, the MUX 224 passes L bits of substitute LSB value 244 through to the fraction component 248, aligned to the least-significant bit positions and the upper F-L bits of the fraction component 142 to the upper F-L bit positions within the fraction component 148. In one embodiment, the divider count register 126, substitute LSB value register 127, and LSB mode register 128 may be programmed by a frequency synthesizer configuration software module (not shown) responsible for configuring the fractional-N frequency synthesizer 100.

By modifying the least-significant portion of fraction component 242, fraction component 248 may be conveniently generated to avoid highly correlated sequences of feedback count 154, thereby reducing the highly correlated modulation of VCO 116. As a result, the energy that would otherwise correlate to form fractional spurs is, instead, averaged over the spectrum of the output signal 134. Note that appropriately small changes to the least significant bits of the fixed-point divider count value 240 will generally not produce problematic variation in the final VCO output frequency.

Figure 1:
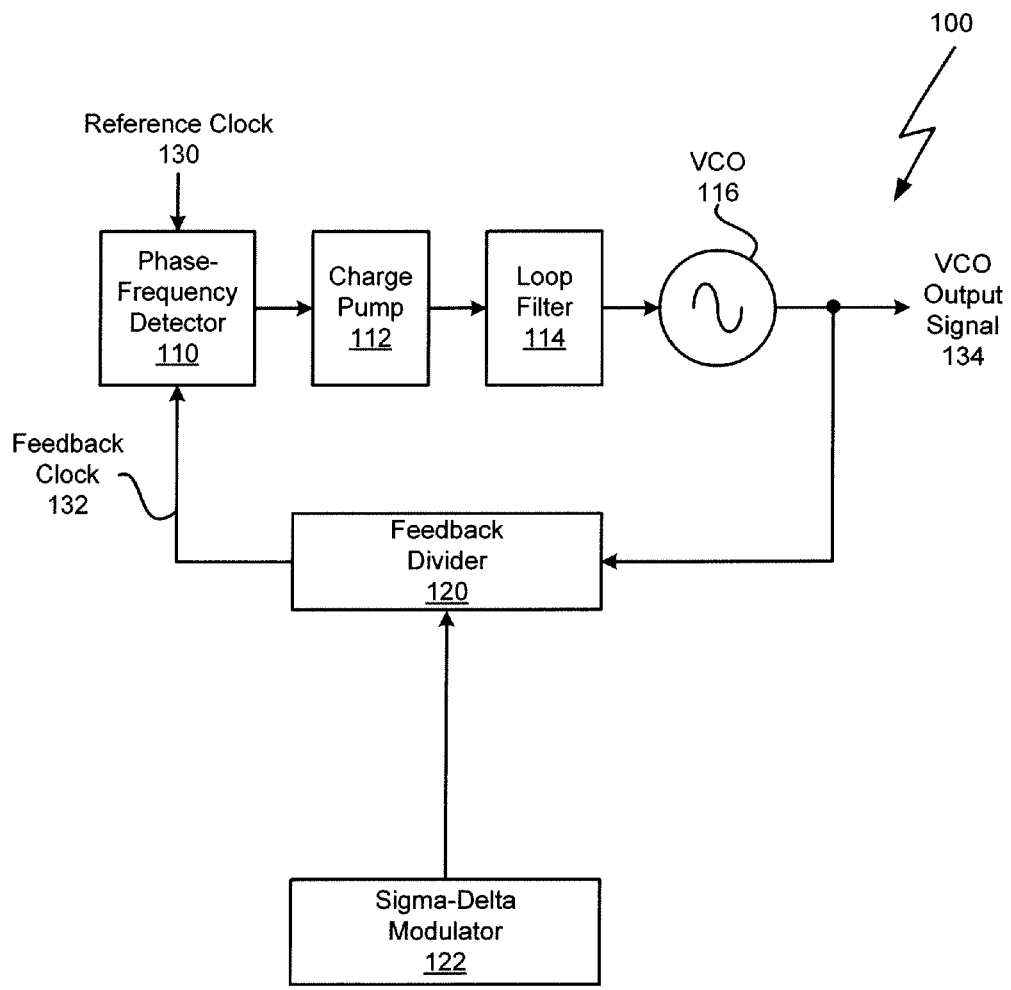
FIG. 1 is a block diagram of a prior art fractional-N frequency synthesizer.
Figure 3A:
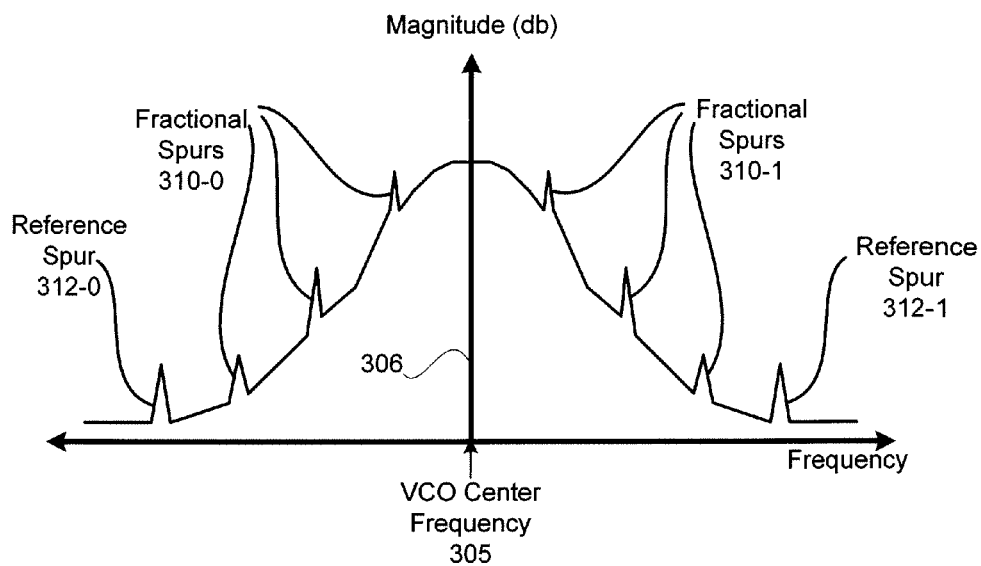
FIGS. 3A and 3B illustrate fractional spur attenuation in the spectral content of a frequency synthesizer output signal, in accordance with one or more aspects of the present invention.
Figure 3B:
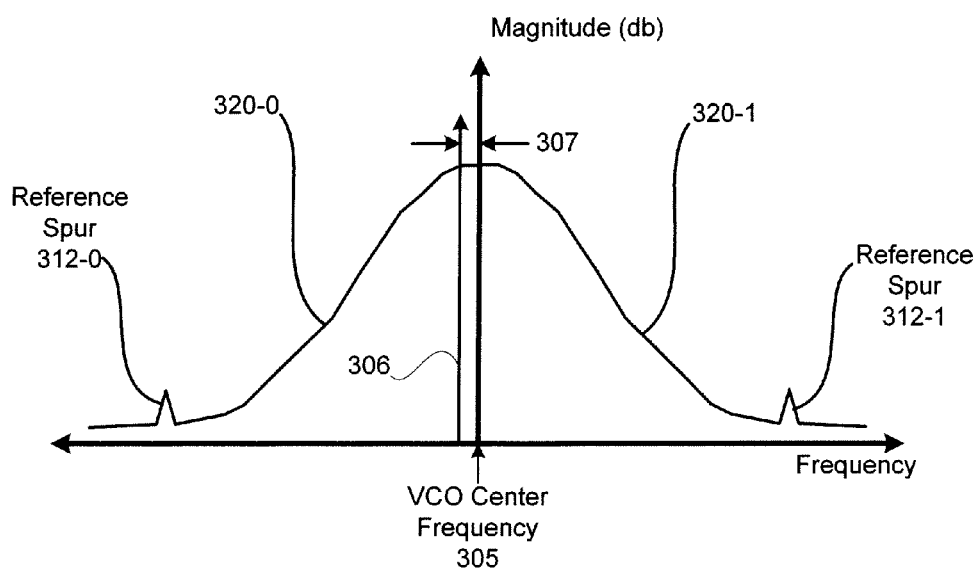

FIGS. 3A and 3B illustrate fractional spur attenuation in the spectral content of a frequency synthesizer output signal, in accordance with one or more aspects of the present invention. FIG. 3A illustrates the spectral content of the VCO output signal 134 of FIG. 1 in a conventional pathological scenario for fractional spurs. These pathological scenarios may occur when the fraction component 242 is a simple, small fraction such as 0.5 or 0.25. In this scenario, the MUX control signal 246 is de-asserted, thereby causing the fractional-N frequency synthesizer 200 to operate in a conventional mode and to generate fractional spurs 310 (i.e. fractional spurs 310-0 and 310-1) with significant energy. The magnitude of the VCO output signal is maximum at the VCO center frequency 305 and attenuates sharply above and below the VCO center frequency 305. In this scenario, the VCO center frequency 305 corresponds to a nominal center frequency 306, programmed by software. Because of the correlated fractional-bit modulation of the VCO frequency, fractional spurs 310 are generated above and below the center frequency 305. Reference spurs 312 (i.e. reference spurs 312-0 and 312-1) may be present above and below the center frequency 305 at an offset corresponding to the frequency of reference clock 130.

FIG. 3B illustrates the spectral content of the VCO output signal when the MUX control signal 246 is asserted and L bits of the substitute LSB value 244 are represented in the fraction component 248. In this scenario, the sigma-delta modulator 222 is programmed to center the VCO center frequency 205 at and offset 207 from the nominal center frequency 306, programmed into the divider count register 226. In one embodiment, offset 307 is given by the substitute LSB value 244, programmed into the substitute LSB value register 227. In alternative embodiments, the substitute LSB value 244 is a constant value programmed into the fractional-N frequency synthesizer 200 circuitry. By modifying the least significant bits of the fraction component 248 to avoid pathological fraction component values, the overall energy associated with each fractional spur 310 (FIG. 2A) may be spread out in frequency, thereby resulting in averaged spectral energy 320 (i.e. spectral energy 320-0 and 320-1) and generally eliminating fractional spurs 310 from the output signal.

Figure 4:
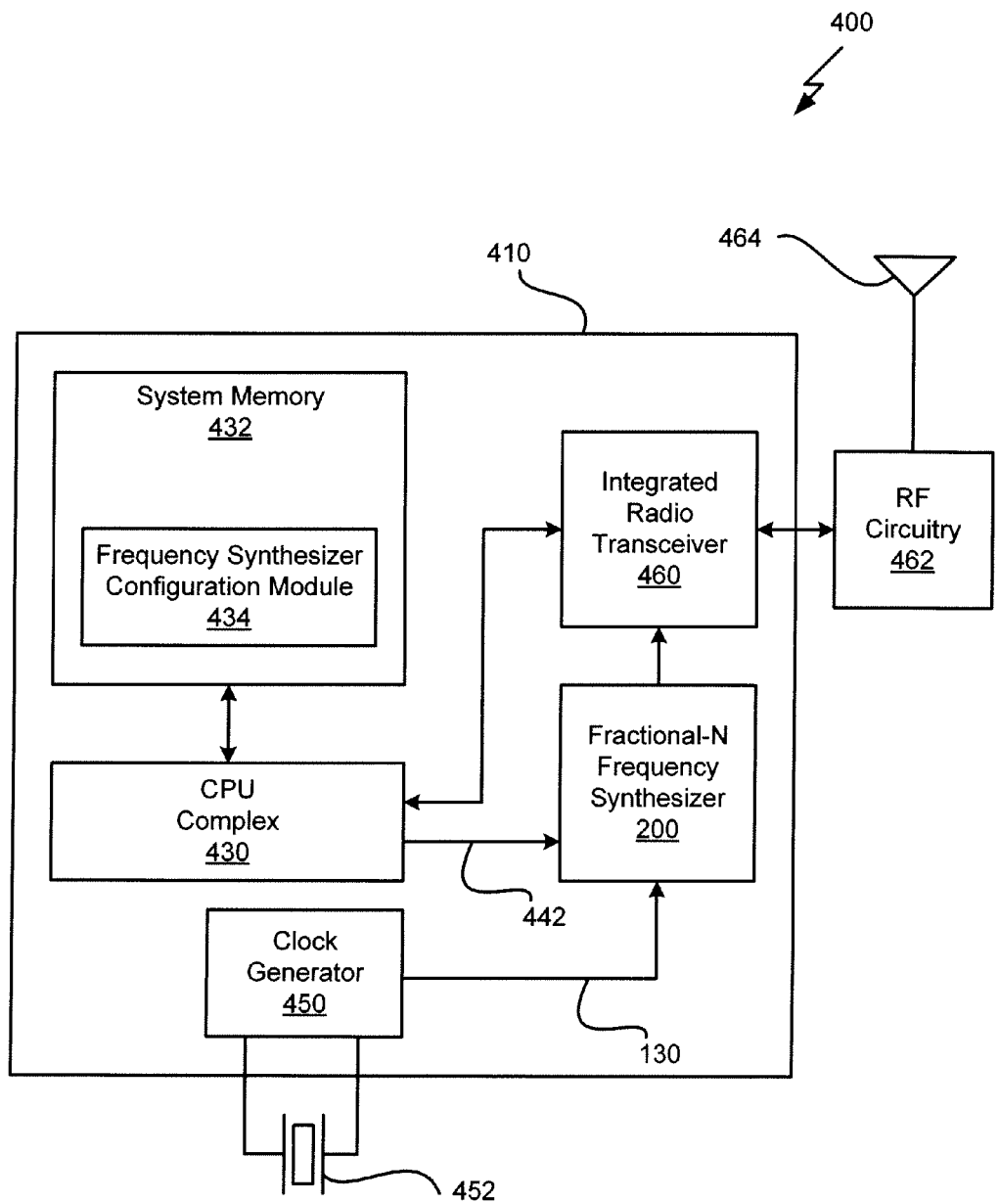
FIG. 4 is a block diagram of a radio-frequency communications subsystem configured to implement one or more aspects of the present invention.

FIG. 4 is a block diagram of a radio-frequency (RF) communications subsystem 400 configured to implement one or more aspects of the present invention. The RF communications subsystem 400 includes an integrated radio chip 410, an antenna 464, RF circuitry 462, and a resonator 452.

The resonator 452 may include a quartz crystal, ceramic resonator, external oscillator, or any technically feasible combination of components configured to provide a stable, accurate frequency reference. The RF circuitry 462 provides any filtering, impedance matching, amplification or other signal processing needed to effectively couple the integrated radio chip 410 to the antenna 464. The antenna 464 may be any technically feasible structure configured to transmit and receive electromagnetic RF signals.

The integrated radio chip 410 includes a central processing unit (CPU) complex 430, a system memory 432, a clock generator 450, a fractional-N frequency synthesizer 200, and an integrated radio transceiver 460. The CPU complex 430 includes at least one CPU configured to interface with the system memory 432 in order to execute programming instructions stored in the system memory 432. The CPU complex 430 may also include any technically appropriate interface circuitry used to interoperate with other circuitry incorporated in the integrated radio chip 410. For example, the CPU complex 430 includes interface circuitry for controlling an interface bus 442, which in turn is configured to write registers in the fractional-N frequency synthesizer 200. More specifically, the interface bus 442 may be configured to write the divider count register 226, within the fractional-N frequency synthesizer 200, thereby establishing a desired nominal center frequency 306.

The system memory 432 includes a frequency synthesizer configuration module 434 that implements a function for computing the fixed-point divider count value 240 (FIG. 2), which corresponds to a specific desired nominal center frequency 306 to be generated by the fractional-N frequency synthesizer 200.

The clock generator 450 is configured to interact with resonator 452 to produce reference clock 130. For example, clock generator 450 may be configured to cause a quartz crystal to oscillate and produce a stable, accurate frequency reference signal that may be amplified to generate reference clock 130.

The integrated radio transceiver 460 incorporates signal-processing circuitry used to transmit and receive RF signals. The integrated radio transceiver 460 may also incorporate digital modulator/de-modulator circuitry for transmitting and receiving digital data streams. The circuits within the integrated radio transceiver 460 typically require one or more frequency reference signals. Each reference signal should be established at a specified frequency, whereby the specified frequency may change during the course of normal operation. The fractional-N frequency synthesizer 200 is configured to provide a frequency reference signal to the integrated radio transceiver 460.

Figure 5:
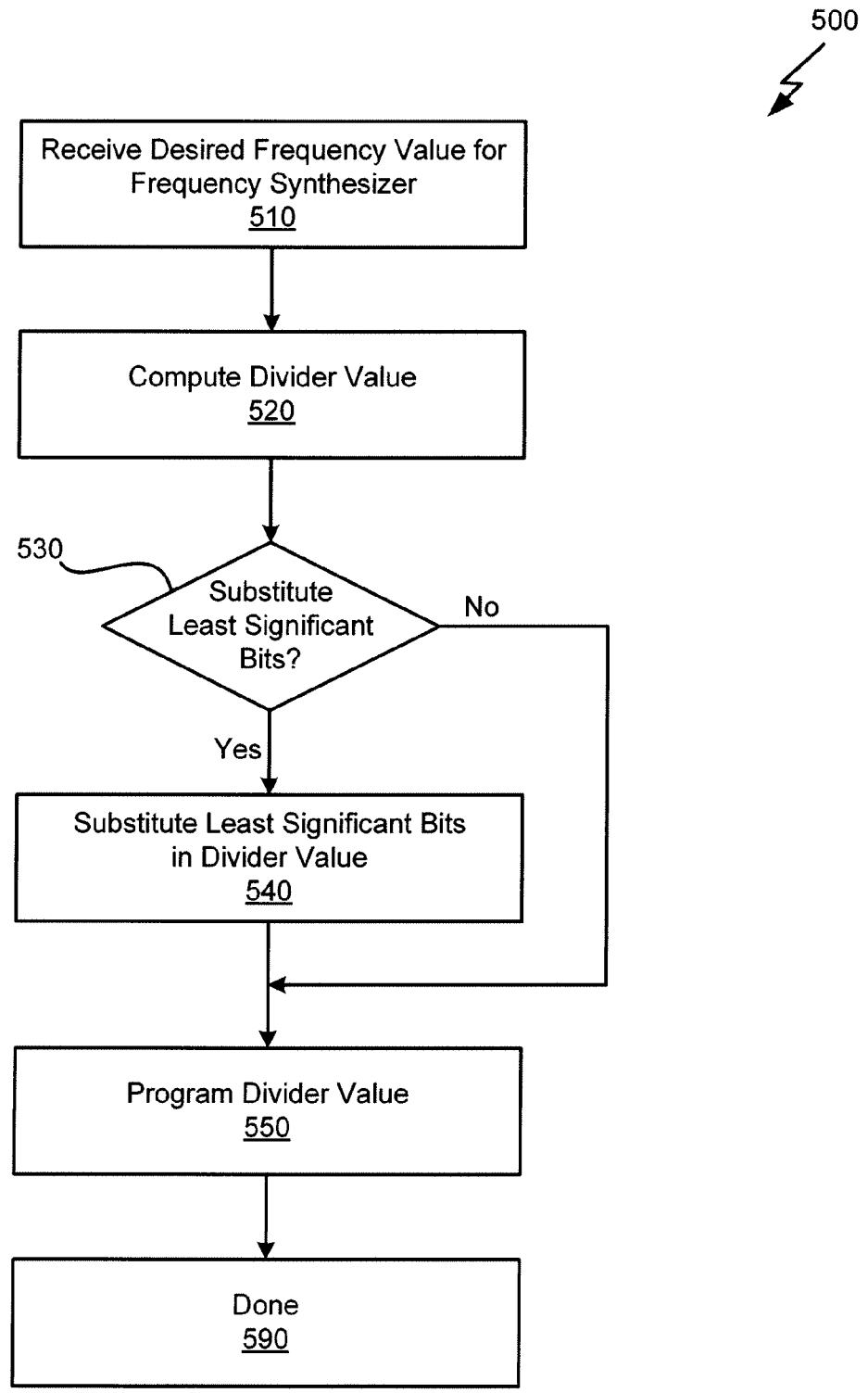
FIG. 5 is a flow diagram of method steps for fractional spur mitigation, in accordance with one or more aspects of the present invention.

FIG. 5 is a flow diagram of method steps for fractional spur mitigation, in accordance with one or more aspects of the present invention. Although the method steps are described in conjunction with the systems of FIGS. 2 and 4, persons skilled in the art will understand that any system that performs the method steps, in any order, is within the scope of the invention.

The method begins in step 510, where a desired frequency value is received for a frequency synthesizer, such as the fractional-N frequency synthesizer 200. The desired frequency may be specified as an index of possible frequencies or a direct representation in cycles per second. In step 520, a divider value, such as fixed-point divider count value 240, is computed to generate a desired VCO output frequency. This computation incorporates any relevant system parameters to compute an accurate divider value and may be performed using any technically feasible technique. In step 530, a determination is made to either retain a set of least significant bits from the divider value or to substitute these least significant bits for a different bit pattern. This determination may be made according to any appropriate technique. For example, if a certain number of least significant bits are sequential zeros, then the decision may be to substitute the least significant bits. If, in step 530, a determination is made to substitute the least significant bits, then the method proceeds to step 540, where the least significant bits are substituted in the divider value. In step 550, the divider value is programmed into the frequency synthesizer. The method terminates in step 590.

Returning to step 530, if a determination is made not to substitute the least significant bits, then the method proceeds to step 550.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. A fractional-N frequency synthesizer circuit, the frequency synthesizer circuit comprising:
 a closed-loop feedback control system configured to generate an oscillating output signal defined by a divider count;
 a modulator circuit configured to generate a sequence of divider counts; and
 a selection circuit configured to modify a first divider count, wherein the modified divider count programs the modulator circuit.

2. The frequency synthesizer circuit of claim 1, wherein the control system comprises a phase-frequency detector, a charge pump, a loop filter, a feedback divider, and a voltage controlled oscillator.

3. The frequency synthesizer circuit of claim 2, wherein the feedback divider comprises a programmable integer divider.

4. The frequency synthesizer circuit of claim 3, wherein the programmable integer divider operates on an 8-bit count value.

5. The frequency synthesizer circuit of claim 2, wherein the voltage controlled oscillator generates a differential output signal.

6. The frequency synthesizer circuit of claim 1, wherein the modulator circuit includes a sigma-delta modulator.

7. The frequency synthesizer circuit of claim 6, wherein the sigma-delta modulator is a third-order sigma-delta modulator.

8. The frequency synthesizer circuit of claim 7, wherein the sigma-delta modulator is configured to operate on a 17-bit fraction component.

9. The frequency synthesizer circuit of claim 1, wherein the selection circuit includes a multiplexer configured to select between sets of least significant bit values.

10. The frequency synthesizer circuit of claim 9, wherein the selection circuit is configured to select between a first value and a second value.

11. The frequency synthesizer circuit of claim 10, wherein the first value is programmed by software and the second value is a preconfigured constant.

12. The frequency synthesizer circuit of claim 10, wherein the first value and second value are programmed by software.

13. A radio-frequency communications subsystem, the subsystem comprising:
 an antenna configured to send and receive radio-frequency electromagnetic signals;
 a radio-frequency circuit coupled to the antenna;
 a resonator configured to provide a frequency reference signal; and
 an integrated radio chip coupled the radio-frequency circuit and to the resonator, wherein the integrated radio chip includes circuitry for transmitting and receiving radio frequency signals, the integrated radio chip including:
  a system memory configured to store programming instructions and data;
  a central processing unit complex configured to program circuitry within the integrated radio chip;
  a clock generator configured to generate a reference clock signal;
  an integrated radio transceiver circuit configured to process radio-frequency electrical signals; and
  a fractional-N frequency synthesizer coupled to the clock generator and to the integrated radio transceiver circuit, wherein the fractional-N frequency synthesizer is configured to substitute at least one programmed least significant bit for an alternate value.

14. The subsystem of claim 13, wherein the alternate value is programmed by software.

15. The subsystem of claim 13, wherein the alternate value is a preconfigured constant.

16. A computer-readable medium including instructions that, when executed by a processing unit, cause the processing unit to compute divider values that mitigate fractional spurs in a frequency synthesizer circuit, by performing the steps of:
 receiving a desired frequency for the frequency synthesizer circuit to generate;
 computing a first divider value for the desired frequency;
 examining the first divider value for values that produce fractional spurs in the frequency synthesizer circuit;
 substituting at least one least significant bit in the first divider value creating a second divider value that mitigates fractional spurs in the frequency synthesizer circuit; and,
 using the second divider value in the frequency synthesizer.

17. The computer-readable medium of claim 16, wherein the desired frequency is specified as an index value.

18. The computer-readable medium of claim 16, wherein the desired frequency is specified in cycles per second.

19. The computer-readable medium of claim 16, wherein the step of determining if the divider value is a pathological fraction comprises determining if the divider value includes a minimum number of zeros in the least significant bit positions.

20. The computer-readable medium of claim 16, wherein the step of substituting at least one least significant bit comprises substituting the at least one least significant bit with a constant.

21. A fractional-N frequency synthesizer circuit comprising:
 a control system configured to generate an oscillating output signal defined by a divider counter;
 an adder coupled to the divider counter configured to determine a divider value used by the divider counter by adding a first value and a second value, wherein the first value is an integer component of a fixed-point divider count and the second value is a fractional component of the fixed-point divider count;
 a sigma-delta modulator coupled to the adder and configured to provide a signed dither value as the second value to the adder;
 a register coupled to the adder configured to store the fixed-point divider count and provide the first value to the adder; and
 a multiplexer coupled to the sigma-delta modulator configured to provide a fractional component of the fixed-point divider count wherein the fractional component is selected from either the register or a substitute LSB register.

* * * * *